United States Patent
Kim et al.

(10) Patent No.: US 9,899,216 B2
(45) Date of Patent: Feb. 20, 2018

(54) SEMICONDUCTOR DEVICE MANUFACTURING METHOD

(71) Applicant: KOREA ADVANCED INSTITUTE OF SCIENCE AND TECHNOLOGY, Daejeon (KR)

(72) Inventors: Jeoungwoo Kim, Daejeon (KR); Wangyu Lee, Seoul (KR); Hoseung Jeon, Uijeongbu-si (KR); Junghwan Hyung, Daejeon (KR); Jaehong Park, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 15/329,894

(22) PCT Filed: Oct. 28, 2014

(86) PCT No.: PCT/KR2014/010153
§ 371 (c)(1),
(2) Date: Jan. 27, 2017

(87) PCT Pub. No.: WO2016/035925
PCT Pub. Date: Mar. 10, 2016

(65) Prior Publication Data
US 2017/0301541 A1  Oct. 19, 2017

(30) Foreign Application Priority Data
Sep. 5, 2014  (KR) .......................... 10-2014-0118529

(51) Int. Cl.
*H01L 21/02*  (2006.01)
*H01L 29/786*  (2006.01)
(Continued)

(52) U.S. Cl.
CPC .. *H01L 21/02639* (2013.01); *H01L 21/02603* (2013.01); *H01L 29/0673* (2013.01);
(Continued)

(58) Field of Classification Search
None
See application file for complete search history.

(56) References Cited

U.S. PATENT DOCUMENTS

2012/0190155 A1  7/2012  Chu et al.
2016/0118482 A1*  4/2016  Hong .................... B82Y 10/00
                                                             438/157

(Continued)

FOREIGN PATENT DOCUMENTS

KR          10-0716937 B1     5/2007
KR       10-2011-0100993 A    9/2011
(Continued)

*Primary Examiner* — Asok K Sarkar
(74) *Attorney, Agent, or Firm* — Sang Ho Lee; Novick, Kim & Lee, PLLC

(57) ABSTRACT

The present invention provides a semiconductor device manufacturing method for lowering the technical difficulties of a process forming a horizontal single crystal nanowire and a manufacturing cost, the semiconductor device manufacturing method comprising the steps of: preparing a substrate including a first area and a second area; determining a position at which a nanowire is to be formed on the substrate of the first area and arranging an empty space in which the nanowire is to be filled; exposing a substrate surface of a part adjacent to the first area; causing selective single crystal growth from the exposed substrate surface; and forming a nanowire by a self-aligned method through an etching process within the first area, and removing, from outside the first area, a single crystal growth layer of the remaining areas excluding a part necessary for the wiring of the second area.

18 Claims, 7 Drawing Sheets

(51) Int. Cl.
*H01L 29/66* (2006.01)
*H01L 29/06* (2006.01)
*H01L 29/423* (2006.01)

(52) U.S. Cl.
CPC .. *H01L 29/42392* (2013.01); *H01L 29/66742* (2013.01); *H01L 29/78696* (2013.01)

(56) References Cited

U.S. PATENT DOCUMENTS

2016/0254350 A1\* 9/2016 Cheng ................. H01L 21/0245
257/347
2017/0263708 A1\* 9/2017 Then ................. H01L 29/66469

FOREIGN PATENT DOCUMENTS

| KR | 10-1155176 A | 6/2012 |
| KR | 10-2013-0079703 A | 7/2013 |

\* cited by examiner

SEMICONDUCTOR DEVICE MANUFACTURING METHOD

TECHNICAL FIELD

The present invention relates to a method of manufacturing a semiconductor device, and more particularly, to a method of manufacturing a single crystal nanowire applicable to a semiconductor device.

BACKGROUND ART

Single crystal semiconductor nanowires are expected to be applied to various industries such as chemical sensors, biosensors, environmental sensors, field-effect transistors, and energy harvesting because of their unique and superior electronic, optical, mechanical, thermal and chemical properties.

The nanowire manufacturing method can be roughly divided into a bottom-up process and a top-down process. The bottom-up process has difficulties in controlling the position and shape of the nanowires and has low reproducibility. The top-down process has the advantage of being able to control the position and shape and has high reproducibility, but lithography equipment and processes such as Immersion ArF Scanners, Extreme Ultra-violet (EUV) laser beams, and electron beams for manufacturing nanowires are too expensive, thereby hindering the industrial application of nanowires. In addition, in a horizontal nanowire, two axes, except for one long axis, must have a nano-size (usually not larger than 100 nm). To accomplish this, the nanowire must be electrically isolated from the substrate. However, there is no reproducible method for manufacturing single crystal nanowires electrically isolated from the substrate, except for the expensive method of using a silicon-on-insulator (SOI) substrate, so it is essential to develop a new manufacturing method.

DETAILED DESCRIPTION OF THE INVENTION

Technical Problem

The present invention has been made to solve a lot of problems including the above ones, by providing a low-cost and reproducible method for manufacturing a horizontal single crystal nanowire electrically isolated from a substrate. However, these problems are for illustrative purposes only, and the scope of the present invention is not limited thereto.

Technical Solution

A method for manufacturing a semiconductor device according to an aspect of the present invention in order to solve the above-described problems. The method includes: a first step of forming an intermediate structure having at least one cavity; and a second step of forming a single crystal nanowire in a self-aligned manner, with selective single crystal growth occurring from an exposed surface of a substrate and at least portion of the cavity being filled, wherein the cavity extends in a direction parallel to the substrate while being spaced apart from the substrate such that the single crystal nanowire is electrically isolated from the substrate.

In the method for manufacturing a semiconductor, the cavity may be arranged such that the cavity is spaced apart from the substrate and is not disposed directly on the exposed surface of the substrate where the selective single crystal growth occurs. The cavity may have a shape that is open to the outside at the side of the intermediate structure.

In the method for manufacturing a semiconductor, the intermediate structure may include a gate pattern and a hard mask pattern sequentially stacked on the substrate, the cavity may be formed as the gate pattern is recessed to the inside of the intermediate structure relative to the hard mask pattern, and an oxide film pattern may be formed on the side of the recessed gate pattern.

In the method for manufacturing a semiconductor, the intermediate structure may include a sacrificial film pattern and a hard mask pattern sequentially stacked on the substrate, and the cavity may be formed as the sacrificial film pattern is recessed to the inside of the intermediate structure relative to the hard mask pattern.

In the method for manufacturing a semiconductor, the intermediate structure may include a hard mask pattern formed on the substrate, and the cavity may be formed as the substrate is recessed inwardly and downwardly with respect to the intermediate structure relative to the hard mask pattern.

In the method for manufacturing a semiconductor, the substrate may not be a silicon-on-insulator (SOI) substrate but a bulk wafer or an epitaxial wafer including a Group IV semiconductor, a Group III-V compound semiconductor or a Group II-VI oxide semiconductor, and the first step may include forming an insulating film pattern on the substrate such that the cavity does not directly contact the substrate.

A method for manufacturing a semiconductor device according to another aspect of the present invention in order to solve the above-described problems. In the method for manufacturing a semiconductor device according to another aspect of the present invention, a method for manufacturing a silicon single crystal nanowire using a silicon substrate will be described. However, the technical idea of the present invention is not limited to the manufacturing of silicon nanowires.

A method for manufacturing a semiconductor device according to another aspect of the present invention includes: preparing a substrate including a first region and a second region; determining a position in which a nanowire is formed and providing an empty space to be filled with the nanowire; exposing a surface of the substrate adjacent to the first region; forming a single crystal growth layer through selective single crystal growth that occurs from the exposed surface of the substrate; and forming a nanowire in a self-aligned manner by performing an etching process to the single crystal growth layer in the first region and removing the single crystal growth layer in regions except for the portion necessary for the wiring of the second region.

The method may further include: implanting impurities into the substrate or the nanowire, before and after the selective single crystal growth.

The method may further include: forming an oxide film, between the determining a position in which a nanowire is formed and providing an empty space to be filled with the nanowire and the exposing a surface of the substrate adjacent to the first region.

The method may further include: forming an oxide layer on the exposed surface of the substrate, after the forming a nanowire in a self-aligned manner by performing an etching process to the single crystal growth layer in the first region and removing the single crystal growth layer in regions except for the portion necessary for the wiring of the second region.

The method may further include: entirely or selectively removing a silicon oxide film, a silicon nitride film and/or a silicon film formed in the determining a position in which a nanowire is formed and providing an empty space to be filled with the nanowire, after the nanowire is formed. In addition, the silicon film formed in the determining a position in which a nanowire is formed and providing an empty space to be filled with the nanowire may be used as a gate of a transistor in which the nanowire serves as a channel, through impurity implantation or the like.

The method may further include: forming a metal wiring including doping and forming contacts in the second region, after the nanowire is formed.

In a method for manufacturing a semiconductor device according to still another aspect of the present invention, it may be arranged such that in the determining a position in which a nanowire is formed and providing an empty space to be filled with the nanowire, the empty space to be filled with the nanowire forms a plurality of layers spaced apart from each other on a vertical line of the substrate. The elements of the above-described embodiments can be applied to subsequent steps.

Advantageous Effects

According to the embodiments of the present invention as described above, it is possible to reduce the technical difficulty and manufacturing cost of the process of forming horizontal single crystal nanowires. Furthermore, an array of single crystal nanowires that are single or multi-layered can be easily manufactured. Of course, the scope of the present invention is not limited by these effects.

MODE OF THE INVENTION

Figure 1:
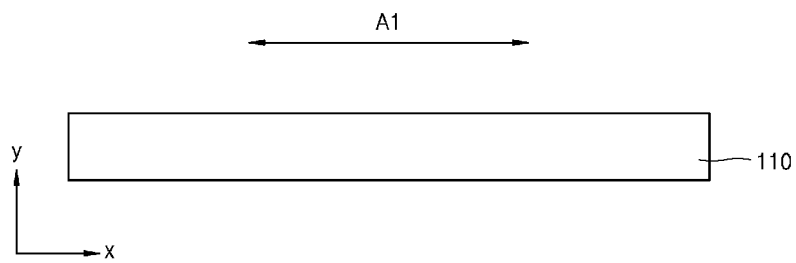
FIGS. 1 to 7 are sectional views sequentially illustrating a method of manufacturing a semiconductor device according to an embodiment of the present invention.

Hereinafter, embodiments of the present invention will be described in detail with reference to the accompanying drawings. It should be understood, however, that the present invention is not limited to the disclosed embodiments, but may be embodied in many different forms. These embodiments are provided so that the disclosure of the present invention will be thorough and complete, and are provided to fully illustrate the scope of the invention to those of ordinary skill in the art. Also, for convenience of explanation, the components may be exaggerated or reduced in size.

In the specification, it will be understood that when an element, such as a layer, region, or substrate, is referred to as being "on," "connected to," "stacked on" or "coupled to" another element, it can be directly "on," "connected to," "stacked on" or "coupled to" the other element or intervening elements may be present. In contrast, when an element is referred to as being "directly on," "directly connected to" or "directly coupled to" another element, there are no intervening elements present. Like numerals refer to like elements throughout. As used herein, the term "and/or" includes any and all combinations of one or more of the associated listed items.

The terminology used herein is for the purpose of describing particular example embodiments only and is not intended to be limiting of the present inventive concept. As used herein, the singular forms are intended to include the plural forms as well, unless the context clearly indicates otherwise. It will be further understood that the terms "comprise" and/or "comprising," when used in this specification, specify the presence of stated features, integers, steps, operations, members, elements, and/or groups thereof, but do not preclude the presence or addition of one or more other features, integers, steps, operations, members, elements, and/or groups thereof.

Spatially relative terms, such as "above" or "upper" and "below" or "lower", may be used herein for ease of description to describe one element's relationship to another element(s) as illustrated in the figures. It will be understood that the spatially relative terms are intended to encompass different orientations of the device in use or operation in addition to the orientation depicted in the figures. For example, if the device in the figures is turned over, elements described as "above" other elements would then be oriented "below" the other elements. Thus, the exemplary term "above" can encompass both an orientation of "below" and "above".

It will be understood that, although the terms first, second etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the present inventive concept.

In the following embodiments, the x-axis, the y-axis, and the z-axis are not limited to three axes on the rectangular coordinate system, and can be interpreted in a broad sense including this. For example, the x, y, and z-axes may be perpendicular to each other, but may indicate different directions that are not perpendicular to each other.

Figure 6:
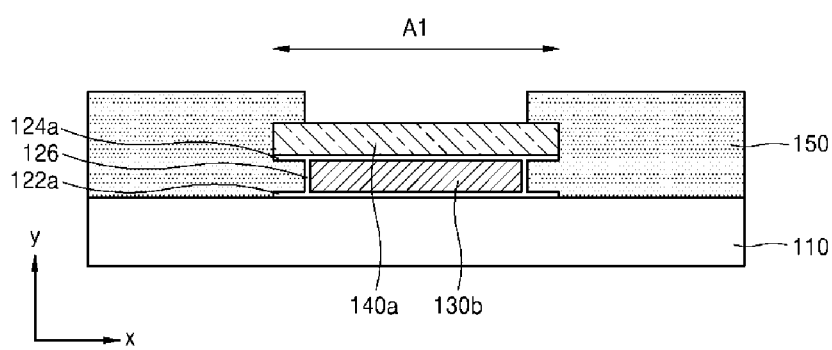
Figure 7:
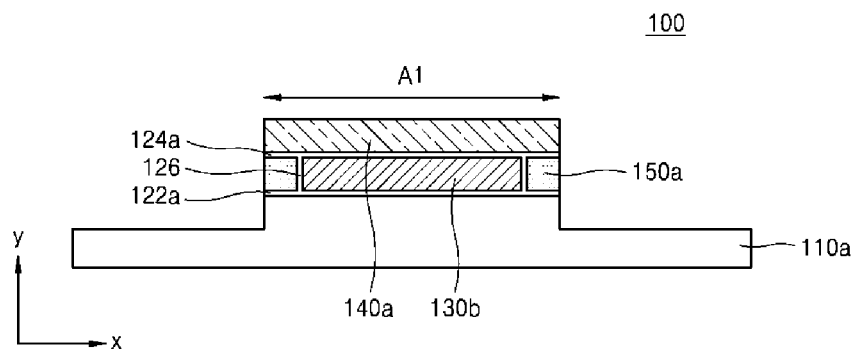
Figure 8:
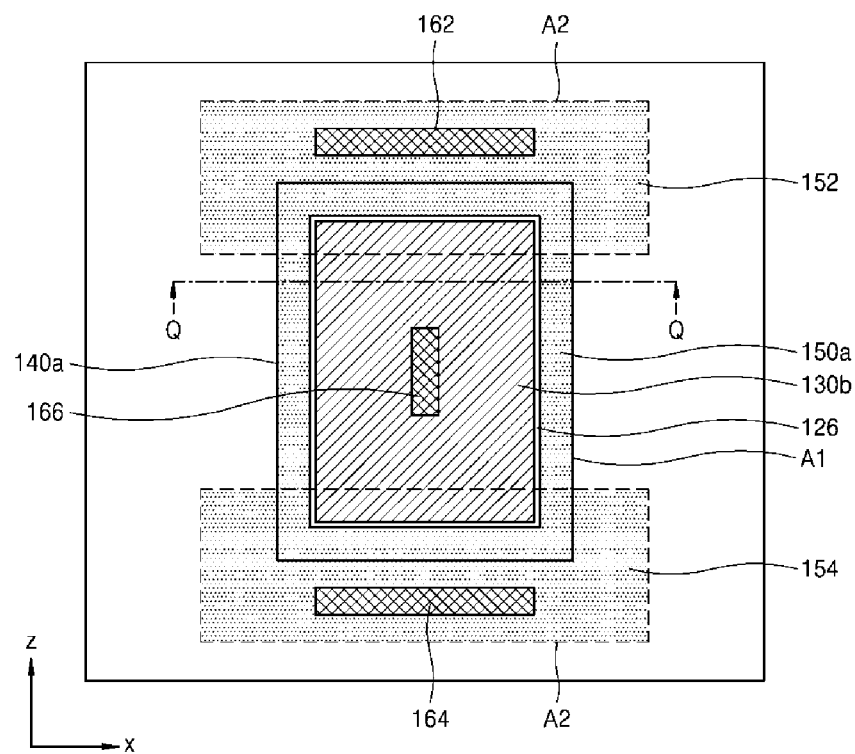
FIG. 8 is a diagrammatic illustration of a semiconductor device according to an embodiment of the present invention.

FIGS. 1 to 7 are cross-sectional views sequentially illustrating a method of manufacturing a semiconductor device according to an embodiment of the present invention. Furthermore, FIG. 8 is a diagrammatic illustration of a semiconductor device according to an embodiment of the present invention.

First, referring to FIG. 1, a substrate 110 including a first region A1 is prepared. The first region A1 is a region where the surface of the substrate 110 is not exposed in a subsequent selective single crystal growth step.

The substrate 110 does not necessarily have to be a silicon-on-insulator (SOI) substrate. For example, the substrate 110 may be a silicon wafer substrate having a predetermined thickness. However, the material constituting the substrate 110 is not limited thereto, and may include various semiconductor materials such as a Group IV semiconductor, a Group III-V compound semiconductor, or a Group II-VI oxide semiconductor. For example, a Group IV semiconductor may include silicon, germanium or silicon-germanium. The substrate 110 may be provided as a bulk wafer or an epitaxial layer.

Figure 2:
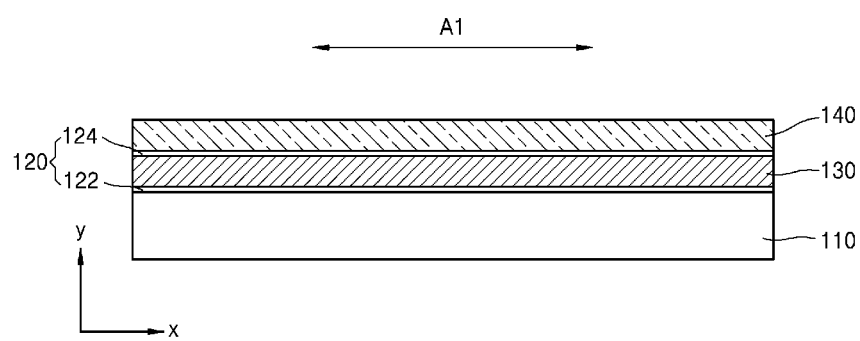
Figure 3:
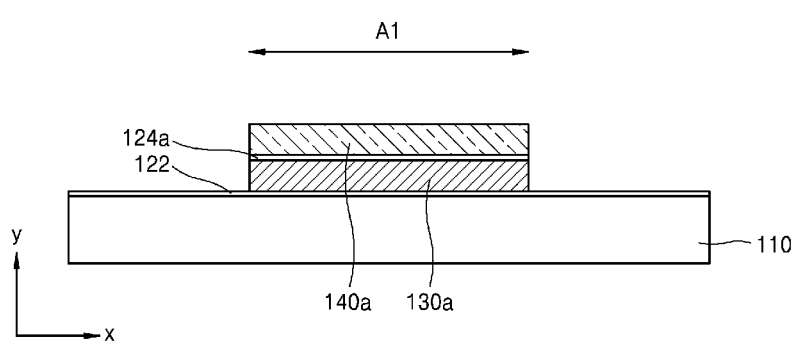

Referring to FIGS. 2 and 3, an embodiment of the present invention includes forming a silicon oxide film 122, a silicon film 130, a silicon oxide film 124, and a silicon nitride film 140 sequentially on the surface of a substrate 110. Subsequently, by using a lithographic process and a dry etching process, the silicon nitride film 140, the silicon oxide film 124, and the silicon film 130 are removed except for in the first region A1 as shown in FIG. 3, thereby forming a silicon oxide film pattern 140a, a silicon oxide film pattern 124a, and a silicon film pattern 130a. Meanwhile, the method of etching (wet and dry etchings) described in the present disclosure is only illustrative and does not limit the technical idea of the present invention.

Here, the first region A1 determines the position where a nanowire (150a, FIG. 7) is formed as will be described later. Furthermore, the thickness of the silicon film 130 determines the y-axis length of the nanowire 150a.

Figure 4:
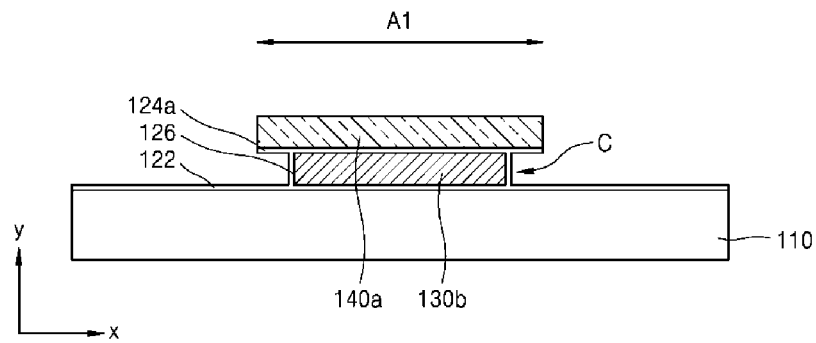

Subsequently, as shown in FIG. 4, part of the silicon film pattern 130a is removed through, for example, a wet etching process, and then an oxide film 126 is formed. The exposed portion of the silicon film pattern 130a is removed first by the wet etching process so that an empty space C to be filled with a single crystal silicon nanowire (150a, FIG. 7) is formed below the silicon nitride film pattern 140a.

Referring to FIGS. 4 and 8, the empty space C may be spaced apart from the substrate 110 and extend in a direction parallel to the substrate 110 (e.g., in a direction parallel to the z-axis) so that the single crystal nanowire 150a is electrically isolated from the substrate 110. The empty space C may have various shapes depending on the shape and size of the longitudinal cross section and the length of the transverse cross section, and may be referred to as various terms such as a cavity, a trench, and a hole.

Here, the x-axis width of the portion removed from the silicon film pattern 130a determines the x-axis length of the nanowire 150a to be formed later.

The silicon film pattern 130b which has gone through the wet etching process may be subject to an additional impurity implantation process and then used as a gate of a transistor in which the nanowire 150a serves as a channel. In this case, the oxide film 126 formed on the side of the silicon film pattern 130b as shown in FIG. 4 serves as a gate oxide film.

Figure 5:
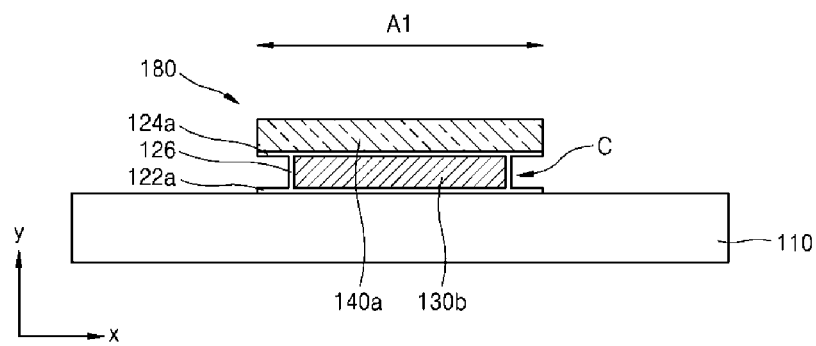

Subsequently, as shown in FIG. 5, part of the oxide film 122 on the surface of the substrate 110 is removed by using the upper silicon nitride film pattern 140a as a hard mask. A silicon single crystal 150 grows later from the exposed surface of the substrate 110.

An intermediate structure 180 shown in FIG. 5 is a structure prior to a selective single crystal growth, and has at least one empty space C. In other aspects, the intermediate structure 180 includes a gate pattern 130b and a hard mask pattern 140a that are sequentially stacked on the substrate 110, and the empty space C is formed as the gate pattern 130b is recessed to the inside of the intermediate structure 180 relative to the hard mask pattern 140a, and an oxide film pattern 126 is formed on the side of the recessed gate pattern 130b.

As described above, the empty space C does not directly contact the substrate 110 so that the single crystal nanowire 150a is electrically isolated from the substrate 110. For example, an oxide film pattern 122a may be interposed between the substrate 110 and the empty space C. The empty space C is arranged such that the empty space C is spaced apart from the substrate 110 and is not disposed directly on the exposed surface of the substrate 110 where the selective single crystal growth occurs, and the empty space C has a shape that is open to the outside at the side of the intermediate structure 180.

Subsequently, a silicon single crystal 150 is grown. FIG. 6 schematically shows a case where the silicon single crystal 150 that is selectively grown fills the empty space C below the silicon nitride film pattern 140a. Although not shown in the drawings, the empty space C below the nitride film pattern 140a may not be completely filled but only partially filled with the grown silicon single crystal 150. Therefore, according to the technical idea of the present invention, the grown silicon single crystal 150 may fill at least part of the empty space C below the silicon nitride film pattern 140a.

Subsequently, a dry etching process is performed on the silicon single crystal 150 through a lithographic process. During the dry etching process, in the region not covered with photoresist, the silicon nitride film pattern 140a serves as a hard mask and a nanowire 150a is formed below the silicon nitride film pattern 140a as shown in FIG. 7. In the second region A2 covered with the photoresist, the silicon single crystal 150 remains as it is, as shown in FIG. 6 and is used for the purpose of connecting the nanowire with metal wirings later.

For illustrative purposes, a schematic diagram of a semiconductor device manufactured by a method of manufacturing a semiconductor device according to some embodiments of the present invention is illustrated in FIG. 8, although the present invention is not limited to these drawings. In FIG. 8, the silicon nitride film pattern 140a is represented only by its contours for the sake of convenience.

Referring to FIG. 8, a gate portion of a transistor is disposed on a first region A1 of a substrate, and a source portion and a drain portion are disposed on a second region A2 of the substrate. A contact region 166 of the gate portion, a contact region 162 of the source portion, and a contact region 164 of the drain portion, which can be electrically connected to the upper structure of the transistor, are provided. FIGS. 1 to 7 sequentially illustrate a cross section taken along line Q-Q in FIG. 8. The nanowire 150a extends in a horizontal direction with respect to the substrate while being electrically isolated from the substrate. The silicon film pattern 130b may be formed of a polysilicon material and formed integrally with the source and drain portions.

FIGS. 9 to 13 are cross-sectional views sequentially illustrating a method of manufacturing a semiconductor device according to another embodiment of the present invention, and correspond to an embodiment in which an oxide film is used instead of the silicon film of the embodiment shown in FIGS. 1 to 7 when forming an empty space in which nanowires are to be formed. The description of the substrate including the first region A1 and the second region A2, the empty space C, selective single crystal growth, and the like is the same as those described above.

Figure 9:
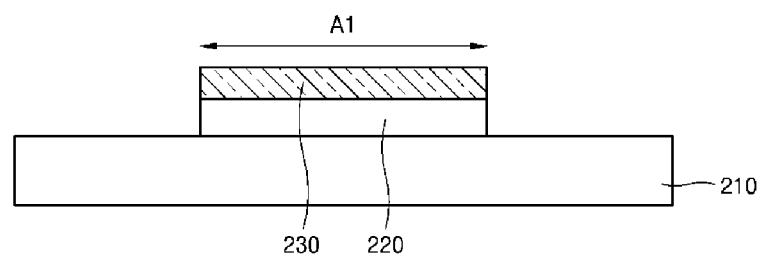
FIGS. 9 to 13 are cross-sectional views sequentially illustrating a method of manufacturing a semiconductor device according to another embodiment of the present invention.
Figure 10:
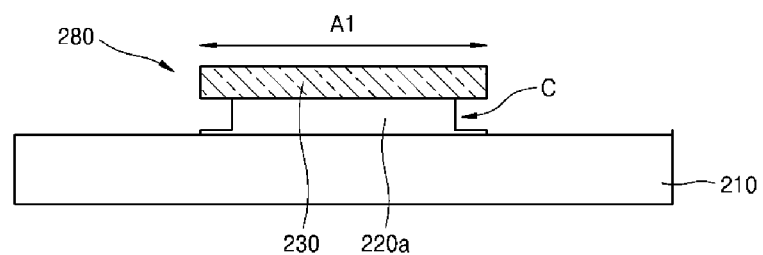

Referring to FIGS. 9 and 10, a substrate 210 including a first region A1 and a second region A2 is prepared. An intermediate structure 280 having an empty space C is provided on the substrate 210. The intermediate structure 280 includes a sacrificial film pattern 220a and a hard mask pattern 230 that are sequentially stacked on the substrate 210. For example, the sacrificial film pattern 220a is comprised of an oxide and the hard mask pattern 230 is comprised of a nitride. In another example, the sacrificial film pattern 220a of FIG. 10 may include an oxide film and a nitride film and the nitride film may serve to electrically isolate the substrate 210 from the empty space C in the intermediate structure 280.

The empty space C is formed as the sacrificial film pattern 220a is recessed to the inside of the intermediate structure 280 relative to the hard mask pattern 230. The empty space C may extend in a direction parallel to the substrate 210 while being spaced apart from the substrate 210 so that the single crystal nanowire (250a, FIG. 12) is electrically isolated from the substrate 210. The oxide film pattern 220a is formed on the substrate 210 so that the empty space C does not directly contact the substrate 210.

Figure 11:
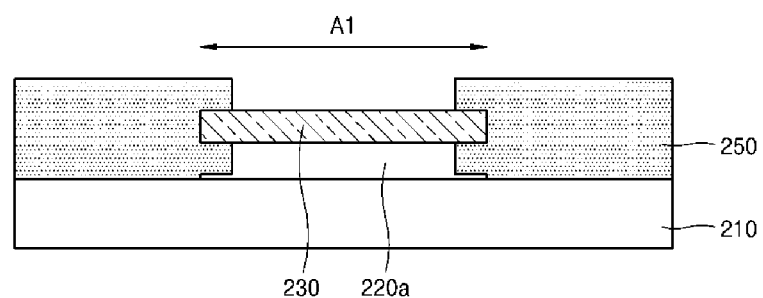
Figure 12:
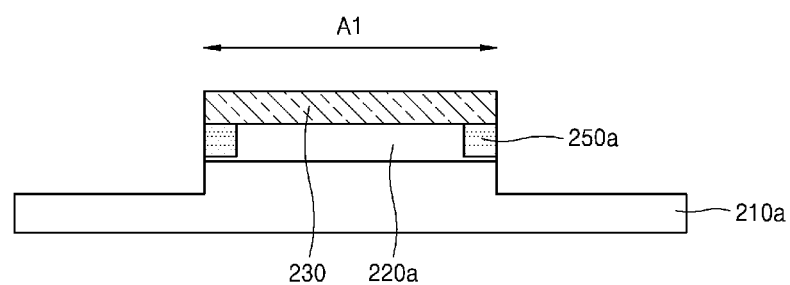

Referring to FIGS. 11 and 12, selective single crystal growth occurs from the exposed surface of the substrate 210 and at least part of the empty space C is filled, thereby forming a single crystal nanowire 250a in a self-aligned manner. Part of the substrate may be recessed during the process of forming a single crystal nanowire 250a by etching part of the selective single crystal growth layer 250 using the hard mask pattern 230.

Figure 13:
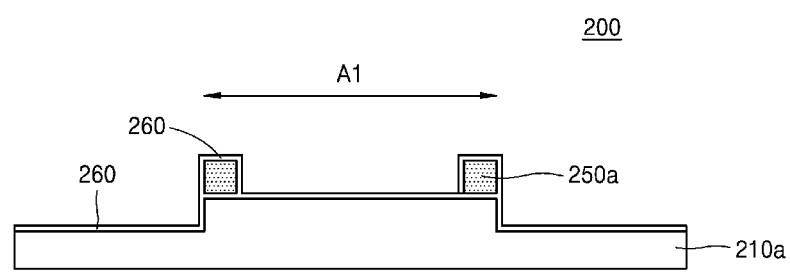

Referring to FIG. 13, after the formation of the single crystal nanowire 250a, the sacrificial film pattern 220a and the hard mask pattern 230 are removed and a gate oxide film 260 surrounding the single crystal nanowire 250a is re-formed. In a modified embodiment, after the formation of the single crystal nanowire 250a, at least part of the surface of the single crystal nanowire 250a is covered with a metal material, a semiconductor material, or an insulating material. Alternatively, a pattern of a metal material, a semiconductor material, or an insulating material is formed on at least part of the surface of the single crystal nanowire 250a. These modified embodiments are applicable to all embodiments of the present invention.

Although not shown in FIG. 13, a polysilicon gate may be formed in a self-aligned manner below the nanowire 250a in a channel region by performing a subsequent etching process, while, outside the channel region, the polysilicon gate may be removed in regions except for the portion necessary for the wiring of the polysilicon gate. Meanwhile, an all-around gate or a triple gate may be formed using the structure 200 shown in FIG. 13.

FIGS. 14 to 18 are cross-sectional views sequentially illustrating a method of manufacturing a semiconductor device according to yet another embodiment of the present invention, and correspond to an embodiment in which a space in which a nanowire is to be formed is formed by direct dry etching and wet etching. The description of the substrate including the first region A1 and the second region A2, the empty space C, selective single crystal growth, and the like is the same as those described above with reference to FIGS. 1 to 7.

Figure 14:
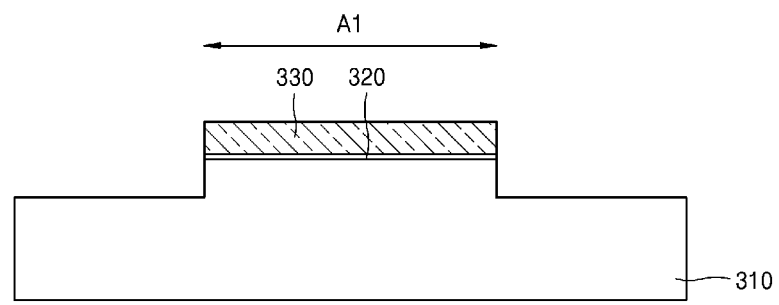
FIGS. 14 to 18 are cross-sectional views sequentially illustrating a method of manufacturing a semiconductor device according to yet another embodiment of the present invention.
Figure 15:
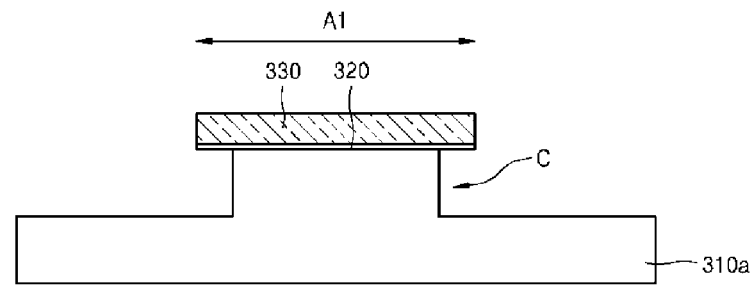
Figure 16:
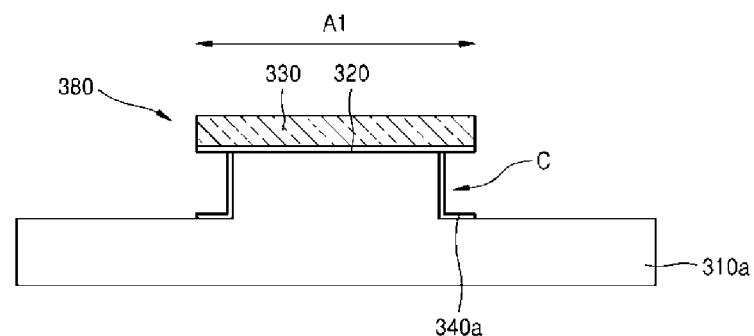

Referring to FIGS. 14 to 16, an oxide film pattern 320 and a nitride film pattern 330 are first disposed on a first region A1 of a substrate 310. The substrate 310 is recessed inwardly and downwardly with respect to the intermediate structure 380 through the etching process using the nitride film pattern 330 as a hard mask. An empty space C provided in the intermediate structure 380 is formed as the substrate 310 is recessed inwardly and downwardly with respect to the intermediate structure 380. An oxide film pattern 340a is formed on the substrate 310 so that the empty space C is not in direct contact with the substrate 310.

Figure 17:
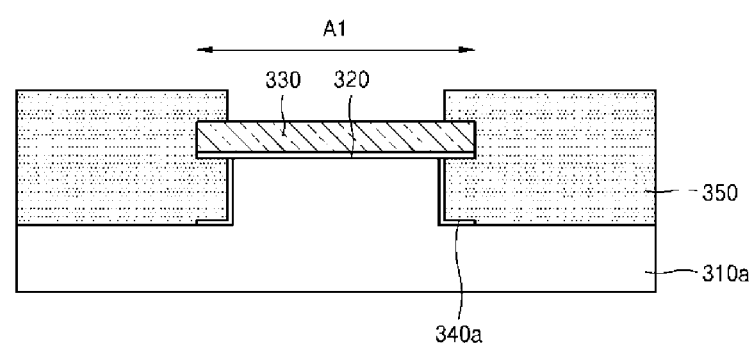
Figure 18:
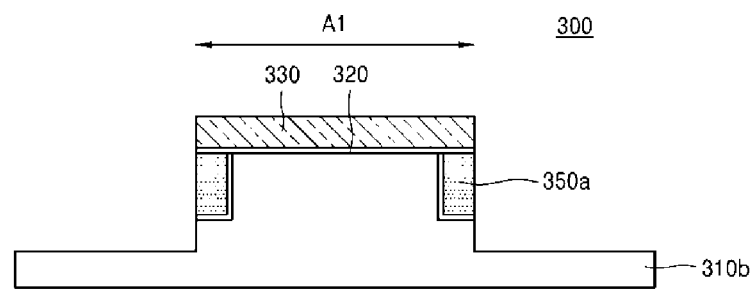

Referring to FIGS. 17 and 18, selective single crystal growth occurs from the exposed surface of the substrate 310 and at least portion of the empty space C is filled, thereby forming a single crystal nanowire 350a in a self-aligned manner. A single gate or a double gate can be formed using the structure 300 shown in FIG. 18.

Figure 19:
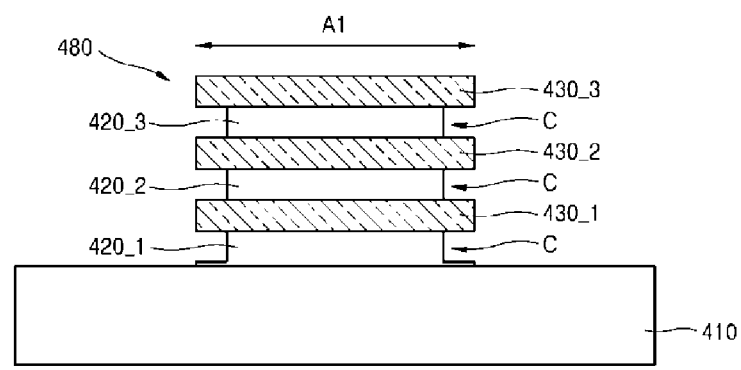
FIGS. 19 and 20 are cross-sectional views sequentially illustrating a method of manufacturing a semiconductor device according to still another embodiment of the present invention.
Figure 20:
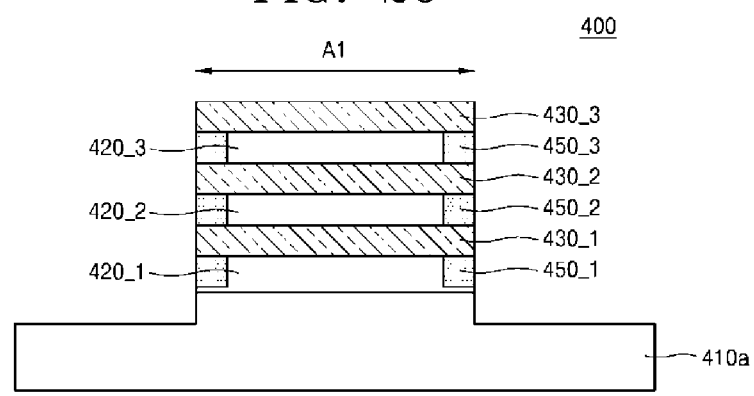

FIGS. 19 and 20 are cross-sectional views sequentially illustrating a method of manufacturing a semiconductor device according to still another embodiment of the present invention, and correspond to an embodiment in which a plurality of layers of nanowires are formed by using the same method. The description of the substrate including the first region A1 and the second region A2, the empty space C, selective single crystal growth, and the like is the same as those described above.

Referring to FIG. 19, an intermediate structure 480 having empty spaces C that form a plurality of layers is disposed on a substrate 410. The empty spaces C to be filled with nanowires 450_1, 450_2, and 450_3 form a plurality of layers spaced apart from each other on a vertical line of the substrate 410. The intermediate structure 480 is a structure in which oxide film patterns 420_1, 420_2, and 420_3 and nitride film patterns 430_1, 430_2, and 430_3 are sequentially stacked alternately.

Referring to FIG. 20, selective single crystal growth occurs from the exposed surfaces of the substrate 410 and at least part of each of the plurality of empty spaces C is filled, thereby forming the single crystal nanowires 450_1, 450_2, and 450_3 in a self-aligned manner.

In the method of manufacturing a semiconductor device according to the above-described embodiments of the present invention, the substrate is not a silicon-on-insulator (SOI) substrate but a bulk wafer or an epitaxial wafer including a Group IV semiconductor, a Group III-V compound semiconductor or a Group II-VI oxide semiconductor, and the forming of the intermediate structure having at least one or more cavities may include forming an insulating film pattern on the substrate such that the cavity does not directly contact the substrate. In the above-described embodiments, the insulating film pattern is, for example, formed of an oxide film pattern. However, the technical idea of the present invention is not limited thereto, and the insulating film pattern may be a pattern of any film including an oxide film and/or a nitride film. According to this structure, it is possible to expect an advantageous effect that the nanowire formed in the cavity can be electrically isolated from the substrate by a relatively simple and efficient method without using an expensive SOI substrate.

According to the technical idea of the present invention, there is provided a method of manufacturing a semiconductor device for lowering the degree of difficulty and manufacturing cost of a process for forming a single crystal nanowire in a lateral direction, comprising the steps of preparing a substrate, determining a position in which a nanowire is formed and providing an empty space to be filled with a nanowire; exposing a surface of a substrate adjacent to the region; growing a single crystal from the exposed surface of the substrate; and forming a nanowire in a self-aligned manner through etching process.

In the case of using the top-down process in the prior art, an expensive silicon-on-insulator (SOI) substrate is used while controlling the position and shape of the nanowire and improving the reproducibility compared to the bottom-up process. The thickness of the SOI was lowered to 40 nm through several oxidation processes, but other sides could not be made smaller than or equal to 100 nm when an electron beam lithography, of which equipment and process is expensive, is not used. Therefore, in fact, a two-dimensional nanowell rather than a one-dimensional nanowire was manufactured.

According to some embodiments of the present invention, in order to manufacture a one-dimensional nanowire without using an SOI substrate, a sidewall cavity is first formed, the cavity is then filled with a single crystal through selective epitaxial growth, and then a nanowire is formed in a self-aligned dry etching manner. The present invention provides for the first time an inexpensive and reproducible method capable of manufacturing a laterally-oriented single crystal nanowire that is electrically isolated from a substrate.

According to the present invention, it is possible to manufacture a laterally-oriented single crystal nanowire that is electrically isolated from a substrate without using an SOI substrate, and the cost is very low compared with the use of an SOI substrate. It is also advantageous to be able to manufacture nanowires without the use of expensive lithographic equipment and processes and to easily adjust the size of the nanowires with the thickness of the deposited film and the degree of wet etching for making the side wall cavities.

While the present invention has been particularly shown and described with reference to embodiments shown in the drawings, it is only for illustrative purposes. It will be understood by those skilled in the art that various modifications and equivalent embodiments may be made. Therefore, the scope of the present invention should be determined by the technical idea of the appended claims.

The invention claimed is:

1. A method for manufacturing a semiconductor device, the method comprising:
    a first step of forming an intermediate structure having at least one cavity; and
    a second step of forming a single crystal nanowire in a self-aligned manner, with selective single crystal growth occurring from an exposed surface of a substrate and at least portion of the cavity being filled,
    wherein the cavity extends in a direction parallel to the substrate while being spaced apart from the substrate such that the single crystal nanowire is electrically isolated from the substrate.

2. The method of claim 1,
    wherein the cavity is arranged such that the cavity is spaced apart from the substrate and is not disposed directly on the exposed surface of the substrate where the selective single crystal growth occurs, and the cavity has a shape that is open to the outside at the side of the intermediate structure.

3. The method of claim 2,
    wherein the intermediate structure includes a gate pattern and a hard mask pattern sequentially stacked on the substrate,
    wherein the cavity is formed as the gate pattern is recessed to the inside of the intermediate structure relative to the hard mask pattern, and
    wherein an oxide film pattern is formed on the side of the recessed gate pattern.

4. The method of claim 3,
    wherein the substrate is not a silicon-on-insulator (SOI) substrate but a bulk wafer or an epitaxial wafer including a Group IV semiconductor, a Group III-V compound semiconductor or a Group II-VI oxide semiconductor, and
    wherein the first step includes forming an insulating film pattern on the substrate such that the cavity does not directly contact the substrate.

5. The method of claim 2,
    wherein the intermediate structure includes a sacrificial film pattern and a hard mask pattern sequentially stacked on the substrate, and
    wherein the cavity is formed as the sacrificial film pattern is recessed to the inside of the intermediate structure relative to the hard mask pattern.

6. The method of claim 5,
    wherein the substrate is not a silicon-on-insulator (SOI) substrate but a bulk wafer or an epitaxial wafer including a Group IV semiconductor, a Group III-V compound semiconductor or a Group II-VI oxide semiconductor, and
    wherein the first step includes forming an insulating film pattern on the substrate such that the cavity does not directly contact the substrate.

7. The method of claim 2,
    wherein the intermediate structure includes a hard mask pattern formed on the substrate, and
    wherein the cavity is formed as the substrate is recessed inwardly and downwardly with respect to the intermediate structure relative to the hard mask pattern.

8. The method of claim 7,
    wherein the substrate is not a silicon-on-insulator (SOI) substrate but a bulk wafer or an epitaxial wafer including a Group IV semiconductor, a Group III-V compound semiconductor or a Group II-VI oxide semiconductor, and
    wherein the first step includes forming an insulating film pattern on the substrate such that the cavity does not directly contact the substrate.

9. A method for manufacturing a semiconductor device, the method comprising:
    preparing a substrate including a first region and a second region;
    determining a position in which a nanowire is formed and providing an empty space to be filled with the nanowire;
    exposing a surface of the substrate adjacent to the first region;
    forming a single crystal growth layer through selective single crystal growth that occurs from the exposed surface of the substrate; and
    forming a nanowire in a self-aligned manner by performing an etching process to the single crystal growth layer in the first region and removing the single crystal growth layer in regions except for the portion necessary for the wiring of the second region.

10. The method of claim 9, further comprising:
    implanting impurities into the substrate or the nanowire, before and after the selective single crystal growth.

11. The method of claim 9, further comprising:
    forming an oxide film,
    between the determining a position in which a nanowire is formed and providing an empty space to be filled with the nanowire and the exposing a surface of the substrate adjacent to the first region.

12. The method of claim 9, further comprising:
    forming an oxide layer on the exposed surface of the substrate,
    after the forming a nanowire in a self-aligned manner by performing an etching process to the single crystal growth layer in the first region and removing the single crystal growth layer in regions except for the portion necessary for the wiring of the second region.

13. The method of claim 12, further comprising:
    forming a spacer on the side wall of the nanowire in order to prevent oxidation.

14. The method of claim 9, further comprising:
entirely or selectively removing a silicon oxide film, a silicon nitride film and/or a silicon film formed in the determining a position in which a nanowire is formed and providing an empty space to be filled with the nanowire, after the nanowire is formed.

15. The method of claim 9,
wherein the determining a position in which a nanowire is formed and providing an empty space to be filled with the nanowire further comprises:
forming a silicon film to be used as a gate of a transistor in which the nanowire serves as a channel.

16. The method of claim 9,
wherein the substrate is used as a gate of a transistor in which the nanowire serves as a channel.

17. The method of claim 9, further comprising:
forming a metal wiring including doping and forming contacts in the second region, after the nanowire is formed.

18. The method of claim 9,
wherein, in the determining a position in which a nanowire is formed and providing an empty space to be filled with the nanowire, the empty space to be filled with the nanowire forms a plurality of layers spaced apart from each other on a vertical line of the substrate.

\* \* \* \* \*